(12) United States Patent
Hild et al.

(10) Patent No.: US 12,210,289 B2
(45) Date of Patent: Jan. 28, 2025

(54) MIRROR, IN PARTICULAR FOR A MICROLITHOGRAPHIC PROJECTION EXPOSURE APPARATUS

(71) Applicant: Carl Zeiss SMT GmbH, Oberkochen (DE)

(72) Inventors: Kerstin Hild, Waldstetten (DE); Toralf Gruner, Aalen (DE); Daniel Golde, Oberkochen (DE); Hans Michael Stiepan, Aalen (DE); Vitaliy Shklover, Heidenheim (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 195 days.

(21) Appl. No.: 18/082,964

(22) Filed: Dec. 16, 2022

(65) Prior Publication Data

US 2023/0122333 A1 Apr. 20, 2023

Related U.S. Application Data

(63) Continuation of application No. PCT/EP2021/065326, filed on Jun. 8, 2021.

(30) Foreign Application Priority Data

Jun. 22, 2020 (DE) .......................... 102020207699.5

(51) Int. Cl.
*G03F 7/00* (2006.01)
(52) U.S. Cl.
CPC ...... *G03F 7/70308* (2013.01); *G03F 7/70175* (2013.01)
(58) Field of Classification Search
CPC ............ G03F 7/70308; G03F 7/70175; G21K 2201/061; H10N 30/704; G02B 26/0825; G02B 26/0858
See application file for complete search history.

(56) References Cited

U.S. PATENT DOCUMENTS

| 4,533,449 A | 8/1985 | Levenstein |
| 8,708,508 B2 * | 4/2014 | Bruchmann ........... G02B 26/06 359/846 |

(Continued)

FOREIGN PATENT DOCUMENTS

| DE | 102004051838 A1 | 5/2005 |
| DE | 102011005940 A1 | 9/2012 |

(Continued)

OTHER PUBLICATIONS

International Search Report, PCT/EP2021/065326, Sep. 30, 2021, 2 pages.

(Continued)

*Primary Examiner* — Hung V Nguyen
(74) *Attorney, Agent, or Firm* — Edell, Shapiro & Finnan, LLC

(57) ABSTRACT

A mirror, e.g. for a microlithographic projection exposure apparatus, includes an optical effective surface, a mirror substrate, a reflection layer stack for reflecting electromagnetic radiation incident on the optical effective surface, at least one first electrode arrangement, at least one second electrode arrangement, and an actuator layer system situated between the first and the second electrode arrangements. The actuator layer system is arranged between the mirror substrate and the reflection layer stack, has a piezoelectric layer, and reacts to an electrical voltage applied between the first and the second electrode arrangements with a deformation response in a direction perpendicular to the optical effective surface. The deformation response varies locally by at least 20% in PV value for a predefined electrical voltage that is spatially constant across the piezoelectric layer.

22 Claims, 11 Drawing Sheets

(56) References Cited

U.S. PATENT DOCUMENTS

| | | | |
|---|---|---|---|
| 9,442,383 B2 | 9/2016 | Dinger et al. | |
| 9,785,054 B2 * | 10/2017 | Gruner | G02B 5/0816 |
| 9,997,268 B2 | 6/2018 | Dinger et al. | |
| 10,908,509 B2 * | 2/2021 | Lippert | G03F 7/70316 |
| 2004/0202898 A1 | 10/2004 | Van Dijsseldonk et al. | |
| 2004/0233553 A1 | 11/2004 | Shibata et al. | |
| 2006/0018045 A1 | 1/2006 | Moeller et al. | |
| 2014/0285783 A1 | 9/2014 | Dinger et al. | |
| 2016/0209751 A1 | 7/2016 | Gruner et al. | |
| 2020/0174379 A1 | 6/2020 | Wylie-Van Eerd et al. | |
| 2021/0055662 A1 | 2/2021 | Hild et al. | |
| 2021/0149310 A1 | 5/2021 | Lippert et al. | |
| 2022/0113634 A1 | 4/2022 | Stiepan et al. | |

FOREIGN PATENT DOCUMENTS

| | | |
|---|---|---|
| DE | 102011081603 A1 | 10/2012 |
| DE | 102011077234 A1 | 12/2012 |
| DE | 102011084649 A1 | 4/2013 |
| DE | 102013219583 A1 | 4/2015 |
| DE | 102015213273 A1 | 1/2017 |
| DE | 102016224202 A1 | 1/2017 |
| DE | 102016201445 A1 | 2/2017 |
| DE | 102017217695 A1 | 6/2018 |
| EP | 2689427 B1 | 5/2017 |
| EP | 3323130 B1 | 6/2019 |
| EP | 3933882 A1 | 1/2022 |
| WO | 2013057046 A1 | 4/2013 |
| WO | 2017009005 A1 | 1/2017 |
| WO | 2019029990 A1 | 2/2019 |
| WO | 2019214946 A1 | 11/2019 |
| WO | 2021239355 A1 | 12/2021 |

OTHER PUBLICATIONS

International Search Report and the Written Opinion, PCT/EP2021/065326, Sep. 30, 2021, 15 pages.

Alda et al., "Zernike-based matrix model of deformable mirrors: Optimization of aperture size," Appl. Opt. vol. 32 No. 13 (May 1993) pp. 2431-2438.

Lakshminarayanan, et al., : "Zernike polynomials: A guide", Journal of Modern Optics vol. 58 No. 7 (Apr. 2011) pp. 545-561, DOI: 10.1080/09500340.2011.554896.

Huth et al., "Focused electron beam induced deposition: A perspective", Beilstein Journal of Nanotechnology, vol. 3, Aug. 2012, pp. 597-619.

German Office Action with English translation, Application No. DE 10 2020 207 699.5 dated Dec. 15, 2020, 12 pages.

International Preliminary Report on Patentability and the Written Opinion, PCT/EP2021/065326, Dec. 13, 2022, 10 pages.

Vdovin et al., "Correction of low order aberrations using continuous deformable mirrors," Opt. Express vol. 16 No. 5 (Mar. 2008) pp. 2859-2866.

* cited by examiner

Fig. 3
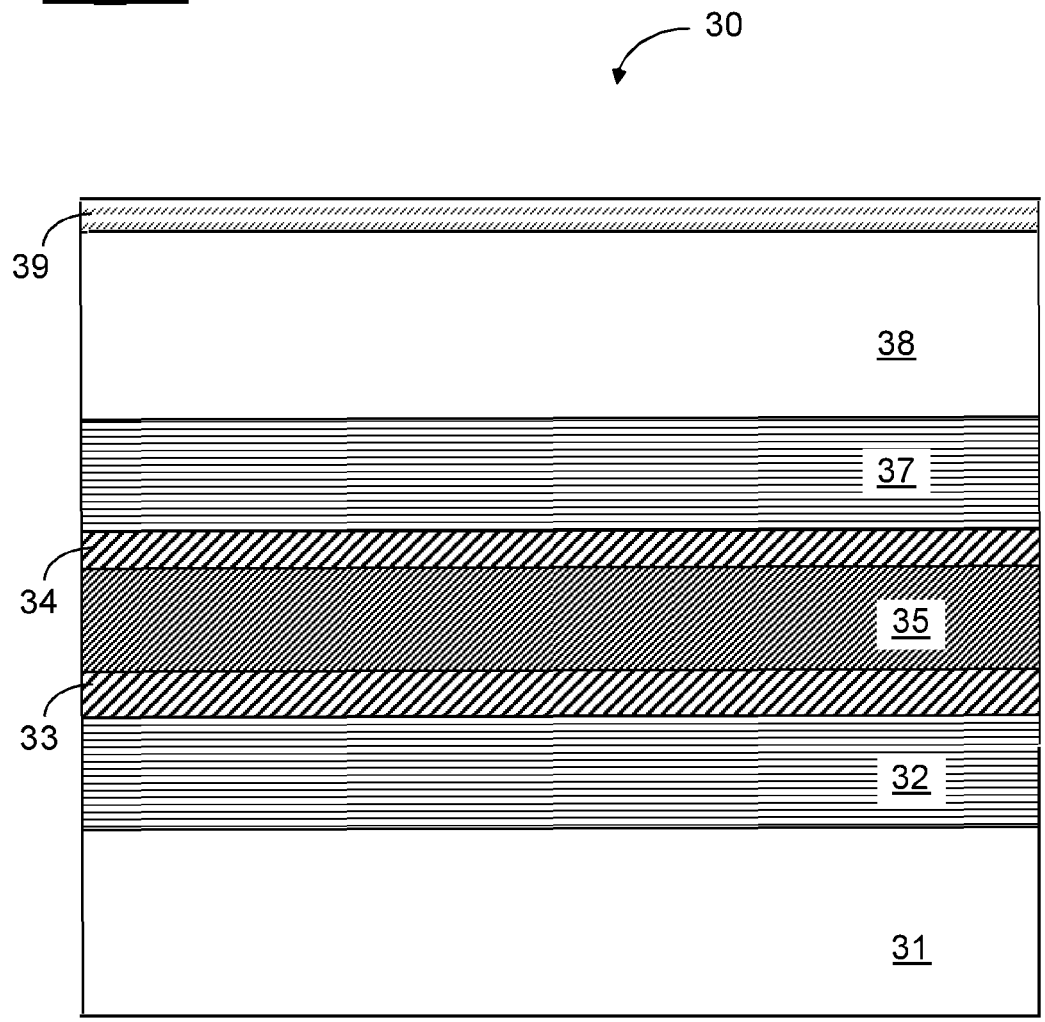
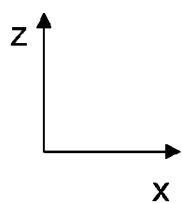

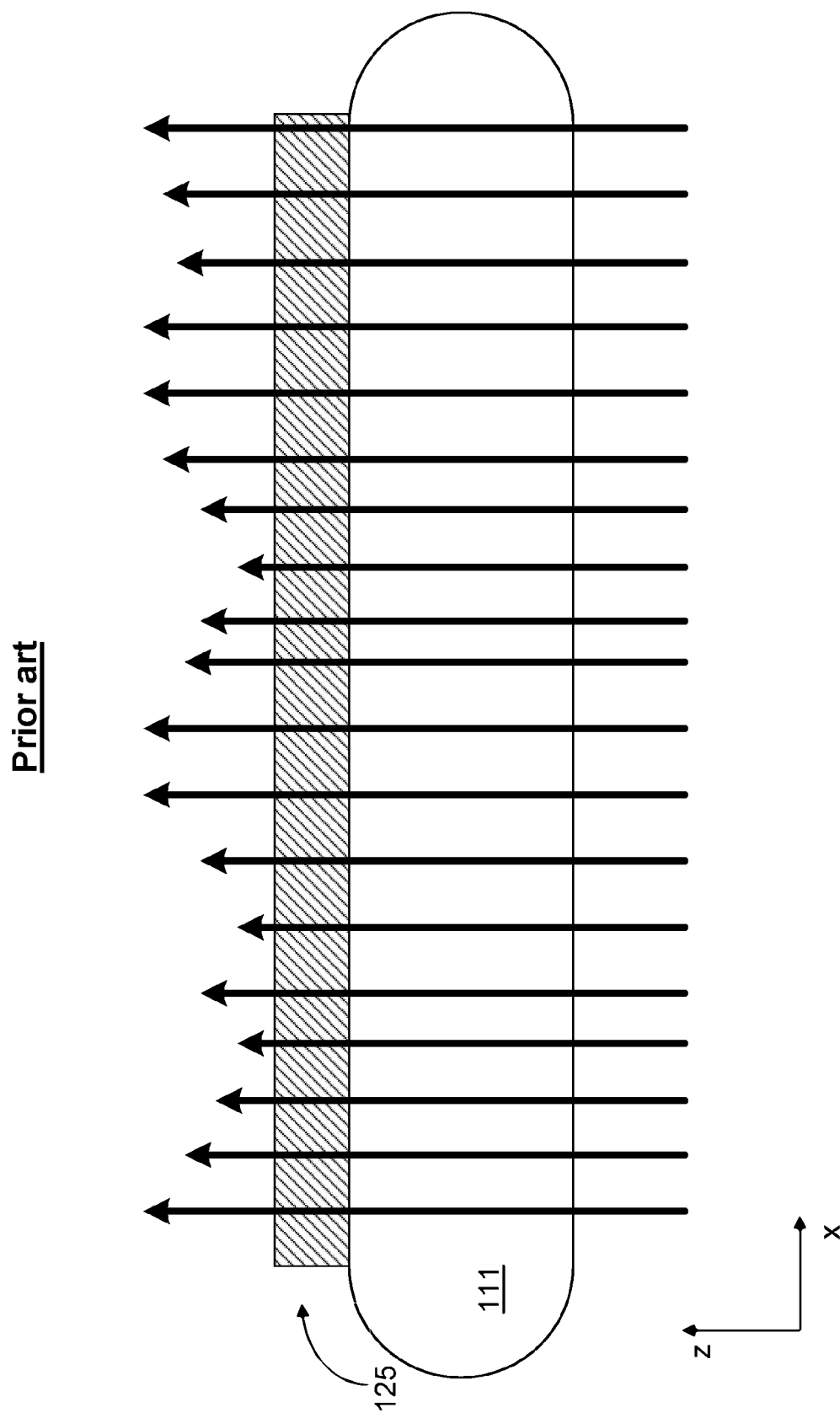

MIRROR, IN PARTICULAR FOR A MICROLITHOGRAPHIC PROJECTION EXPOSURE APPARATUS

CROSS REFERENCE TO RELATED APPLICATIONS

This is a Continuation of International Application PCT/EP2021/065326, which has an international filing date of Jun. 8, 2021, and which claims the priority of German Patent Application 10 2020 207 699.5, filed Jun. 22, 2020. The disclosures of both applications are incorporated in their respective entireties into the present Continuation by reference.

FIELD OF THE INVENTION

The invention relates to a mirror, in particular for a microlithographic projection exposure apparatus.

BACKGROUND

Microlithography is used for producing microstructured components, such as for example integrated circuits or LCDs. The microlithography process is carried out in what is known as a projection exposure apparatus, which includes an illumination device and a projection lens. The image of a mask (=reticle) illuminated by the illumination device is projected here by the projection lens onto a substrate (e.g. a silicon wafer) coated with a light-sensitive layer (=photoresist) and disposed in the image plane of the projection lens, in order to transfer the mask structure to the light-sensitive coating of the substrate.

In projection lenses designed for the extreme ultraviolet (EUV) range, i.e., at wavelengths of, e.g., approximately 13 nm or approximately 7 nm, mirrors are used as optical components for the imaging process owing to the lack of availability of suitable light-transmissive refractive materials.

In this case, it is also known to configure one or more mirrors in an EUV system as an adaptive mirror with an actuator layer composed of a piezoelectric material, wherein an electric field having a locally varying strength is generated across this piezoelectric layer by an electrical voltage being applied to electrodes arranged on both sides with respect to the piezoelectric layer. In the case of a local deformation of the piezoelectric layer, the reflection layer stack of the adaptive mirror also deforms, with the result that, for example, imaging aberrations (possibly also temporally variable imaging aberrations) can be at least partly compensated for by suitable driving of the electrodes.

FIG. 10A shows a construction of a conventional adaptive mirror 110, which is possible in principle, in a merely schematic illustration. The mirror 110 comprises in particular a mirror substrate 111 and also a reflection layer stack 120 and has a piezoelectric layer 115, which is produced from lead zirconate titanate ($Pb(Zr,Ti)O_3$, PZT) in the example. Electrode arrangements are respectively situated above and below the piezoelectric layer 115, by way of which electrode arrangements an electric field for producing a locally variable deformation is able to be applied to the mirror 110. Of said electrode arrangements, the second electrode arrangement facing the substrate 111 is configured as a continuous, planar electrode 113 of constant thickness, whereas the first electrode arrangement has a plurality of electrodes 119, to each of which an electrical voltage relative to the electrode 113 is able to be applied by way of a lead 118. The electrodes 119 are embedded into a common smoothing layer 117, which is produced e.g. from quartz ($SiO_2$) and serves for levelling the electrode arrangement formed from the electrodes 119. Furthermore, the mirror 110 has, between the mirror substrate 111 and the bottom electrode 113 facing the mirror substrate 111, an adhesion layer 112 (e.g. composed of titanium, Ti) and a buffer layer 114 (e.g. composed of $LaNiO_3$), which is arranged between the electrode arrangement facing the substrate 111 and the piezoelectric layer 115 and which further supports the growth of PZT in an optimum, crystalline structure and ensures consistent polarization properties of the piezoelectric layer over the service life.

During operation of the mirror 110 or of an optical system comprising said mirror 110, applying an electrical voltage to the electrodes 113 and 119, by way of the electric field that forms, results in a deflection of the piezoelectric layer 115. In this way, it is possible—for instance for the compensation of optical aberrations e.g. owing to thermal deformations in the case of EUV radiation incident on the optical effective surface 110a—to achieve an actuation of the mirror 110.

In accordance with FIG. 10A, the mirror 110 furthermore has a mediator layer 116. Said mediator layer 116 is in direct electrical contact with the electrodes 119 (which are illustrated in plan view in FIG. 1 only for explanatory purposes). Said mediator layer 116 serves to "mediate" between the electrodes 119 in terms of potential, wherein it has only low electrical conductivity (preferably less than 200 siemens/meter), with the consequence that a potential difference existing between adjacent electrodes 119 is dropped substantially across the mediator layer 116.

Since the above-described application of electrical voltage to the electrode arrangements in the adaptive mirror results in an electric current in the mediator layer 116 and thus, by way of the electrical power generated thereby, in an undesired parasitic evolution of heat, it is desirable, in principle, to limit said electrical power by setting a sufficiently high electrical resistance of the mediator layer 116 (of e.g. 100 k$\Omega$). Even though such a configuration may be suitable for specific scenarios of use of the adaptive mirror such as e.g. for correcting the influence of deformations of the optical elements, such as mirrors or lens elements, that are induced thermally by absorption of radiation, in practice scenarios also exist in which the setting of the desired surface shape of the adaptive mirror has to be effected on a significantly shorter timescale, e.g. within milliseconds (ms). Such scenarios, in which the electrical potential would propagate too slowly in a mediator layer having the above-mentioned high resistances for limiting the electrical power, include e.g. taking into account thermally induced mask deformations in the lithography process, in the case of which, owing to the absorption of more than 30% of the EUV light in terms of order of magnitude, the mask forms an irregular "mountainous region", which ultimately results in a focus variation in the lithographic imaging process. Taking into account the above-described variation of the surface shape of the mask by corresponding setting of the adaptive mirror 110 has to take place in the lithography process already during a scanning operation (e.g. lasting 100 ms in terms of order of magnitude) and thus on a comparatively small time scale of milliseconds (ms). Even though the corresponding driving of the electrodes in the adaptive mirror is readily able to be realized, the practical implementation of the small time constants mentioned proves to be problematic with regard to the mediator layer since reducing the electrical resistance of the mediator layer in turn results in thermal problems owing to the reciprocal dependence of the electrical power in this regard.

Regarding the prior art, reference is made merely by way of example to DE 10 2013 219 583 A1 and DE 10 2015 213 273 A1.

SUMMARY

Objects of the present invention include providing a mirror, in particular for a microlithographic projection exposure apparatus, which makes it possible to correct aberrations with reduced complexity of the construction and providing such a mirror which at last partly avoids the above-described problems particularly with regard to parasitic evolution of heat.

These and other objects are achieved in accordance with the features of the independent claims.

A mirror according to one formulation of the invention comprises:
an optical effective surface;
a mirror substrate;
a reflection layer stack for reflecting electromagnetic radiation that is incident on the optical effective surface;
at least one first electrode arrangement;
at least one second electrode arrangement; and
an actuator layer system situated between the first electrode arrangement and the second electrode arrangement, wherein said actuator layer system is arranged between the mirror substrate and the reflection layer stack;
said actuator layer system comprising a piezoelectric layer and, in reaction to an electrical voltage being applied between the first electrode arrangement and the second electrode arrangement, exhibiting a deformation response characterizing the linear deformation of the actuator layer system in a direction perpendicular to the optical effective surface for a predefined value of the electrical voltage;
wherein said deformation response varies locally by at least 20% in the PV value for a predefined electrical voltage that is spatially constant across the piezoelectric layer.

In accordance with one embodiment, the deformation response varies locally by at least 50%, in particular by at least 70%, more particularly by at least 90%, in the PV value (PV="Peak-to-Valley") for a predefined electrical voltage that is spatially constant across the piezoelectric layer. In this case, the PV value denotes the difference between the maximum and minimum values within the local distribution of the deformation response, the percentage criterion here being related to the largest of these values (i.e. the maximum value).

According to one aspect of the invention, in particular in the case of an adaptive mirror comprising a piezoelectric layer, to which an electric field is able to be applied by way of electrode arrangements, a significant reduction of the complexity of the construction of the mirror is achieved by virtue of the fact that said piezoelectric layer or an actuator layer system comprising said piezoelectric layer is configured in such a way that even with a constant voltage applied by way of the electrode arrangements, the deformation response varies across said actuator layer system or the adaptive mirror.

In other words, this aspect of the invention includes the principle, in particular, in order to introduce a local variation in the deformation profile of the adaptive mirror, of not necessarily applying a locally varying electrical voltage by way of the electrode arrangements, but rather of achieving from the outset a desired local variation with regard to the deformation profile of the adaptive mirror by way of the local variation according to the invention of the deformation response.

On account of this configuration according to the invention, a local variation of the electrical voltage applied to the piezoelectric layer or to the actuator layer system comprising the latter by way of the electrode arrangements is no longer necessary, or is still necessary only to a very small extent (i.e. with just a slight local change in the voltage values), with the consequence that in particular said electrode arrangements can be embodied in continuously planar fashion and the mediator layer explained in the introduction (which, after all, is otherwise intended to serve for mediation in terms of the potential between different electrodes) is dispensable.

Consequently, it is also possible to avoid the problems discussed in the introduction, associated with the use of such a mediator layer and appertaining to conflicting requirements with regard to evolution of heat, on the one hand, and speed of the component, on the other hand. As a result, the invention thus provides an adaptive mirror which is distinguished both by little parasitic evolution of heat and by high speed with regard to the setting of desired surface shapes.

In this case, by dispensing with the use of an electrode arrangement composed of a multiplicity of electrodes that are driveable independently of one another, this aspect of the invention deliberately accepts a lower flexibility or performance of the adaptive mirror with regard to the provision of different deformation profiles, in order in return to achieve the abovementioned advantages in addition to reducing the complexity of the construction.

A further, major advantage of the configuration according to the invention is that on account of dispensing with a multiplicity of electrodes that are driveable independently of one another, or on account of said electrodes being replaced by either one continuously planar electrode or only a few adjacent electrodes covering almost the whole surface area of the piezoelectric layer, it becomes possible to realize leads for supplying voltage to said electrode(s) exclusively "from the side" (i.e. substantially within the plane of the relevant electrode or perpendicular to the stacking direction of the layer construction of the adaptive mirror), that is to say in other words to avoid routing of said leads "in the stacking direction" of the layer construction of the adaptive mirror, which routing is problematic from a production engineering standpoint. In particular, as also described below, even in the case where the relevant electrode arrangement is subdivided into a few electrodes, which for their part have a comparatively large surface area, it is possible to choose a suitable geometry for which each individual one of said electrodes is accessible to said leads from the side in the above sense.

As far as the relinquishment of the need for a mediator layer is concerned, which relinquishment has already been mentioned above and is advantageously achieved according to the invention, this relinquishment is still made possible even in the case of the above-discussed configuration with a comparatively small number of electrodes by virtue of the fact that—as will likewise be explained in even greater detail below—with regard to the configuration of the piezoelectric layer or the actuator layer system according to the invention comprising said piezoelectric layer, care is taken to ensure that the deformation response (in particular the $d_{33}$ coefficient) at the respective boundaries between adjacent electrodes is low and thus even a lack of voltage driving of the piezoelectric layer in said boundary regions is of no significant consequence.

The coefficient that characterizes the linear expansion of the material of the piezoelectric layer that is obtained in a voltage-dependent manner is referred to as the "$d_{33}$ coefficient", and corresponds to the relevant component of the dielectric tensor that is responsible for the linear expansion in a direction perpendicular to the optical effective surface.

In accordance with one embodiment, the piezoelectric layer has a $d_{33}$ coefficient, the value of which varies locally by at least 20% in the PV value across the piezoelectric layer.

As far as the concrete realization of the local variation according to the invention of the deformation response of the piezoelectric layer, or of the actuator layer system comprising said piezoelectric layer, is concerned, said local variation can be achieved in various ways. In this regard, in embodiments, the actuator layer system can have a locally varying thickness, in particular with a local variation by at least 20% in the PV value. In particular, said local variation can be at least 50%, more particularly at least 70%, and more particularly at least 90%.

In particular, in embodiments, a thickness variation of the piezoelectric layer that is suitable for providing the desired local variation of the deformation response can be provided. Alternatively or additionally, in order to achieve a desired deformation response, the stoichiometry of the piezoelectric layer can also be varied in a suitable manner.

In further embodiments, a dielectric layer having for its part a thickness profile that varies in accordance with the desired local variation of the deformation profile can also be used in combination with the piezoelectric layer, in which case the piezoelectric layer can then have a constant thickness. In corresponding embodiments, the actuator layer system according to the invention which provides the locally varying deformation response is then formed by the combination of the piezoelectric layer with said dielectric layer.

In accordance with one embodiment, the actuator layer system thus comprises a dielectric layer in addition to the piezoelectric layer, wherein said dielectric layer can have in particular a locally varying thickness.

In accordance with one embodiment, the first electrode arrangement and the second electrode arrangement each cover at least 99% of the optically used area of the piezoelectric layer.

In accordance with one embodiment, the first electrode arrangement and the second electrode arrangement each have voltage feeds, all of which run perpendicularly to the surface normal of the mirror.

In accordance with one embodiment, the mirror has in a stack a plurality of such actuator layer systems each situated between two electrode arrangements. In this case, mutually different actuator layer systems in said stack can induce different deformation modes in the wavefront of light reflected at the mirror. Said different deformation modes can correspond in particular to different Zernike deformations.

The invention is thus not restricted to the use of just one piezoelectric layer or just one actuator layer system which correspondingly provides the local variation of the deformation response. Rather, a plurality of such piezoelectric layers (or actuator layer systems each comprising a piezoelectric layer) can also be provided, wherein a desired wavefront change (e.g. a Zernike deformation in the wavefront) can be induced by each of said piezoelectric layers or actuator layer systems on account of the respective shape change of the adaptive mirror. Furthermore, said piezoelectric layers or actuator layer systems comprising such piezoelectric layers can be provided in a stacked fashion within one and the same adaptive mirror or else on different mirrors.

In this case, each individual one of said actuator layer systems in said stack can be configured analogously to the above-described embodiments for providing the respectively desired local variation of the deformation response or wavefront change (that is to say e.g. with local thickness variation of the piezoelectric layer, local variation of the stoichiometry of the piezoelectric layer or local thickness variation of an additional dielectric layer).

The invention furthermore also relates to a mirror, in particular for a microlithographic projection exposure apparatus, wherein the mirror has an optical effective surface, comprising
  a mirror substrate;
  a reflection layer stack for reflecting electromagnetic radiation that is incident on the optical effective surface;
  a stack of actuator layer systems each arranged between two electrode arrangements, wherein said stack is arranged between the mirror substrate and the reflection layer stack;
  wherein each of said actuator layer systems comprises a piezoelectric layer and, in reaction to an electrical voltage being applied between the electrode arrangements exhibits a deformation response characterizing the linear deformation of the respective actuator layer system in a direction perpendicular to the optical effective surface for a predefined value of the electrical voltage;
  wherein mutually different actuator layer systems in the stack induce different deformation modes in the wavefront of light reflected at the mirror.

By virtue of the fact that the individual actuator layer systems (or the associated piezoelectric layers or dielectric layers) differ from one another with regard to the respectively provided deformation mode in the wavefront of light reflected at the mirror (that is to say e.g. induce mutually different Zernike deformations in the wavefront), it is possible as a result, with the use of a correspondingly high number of stacked actuator layer systems, to set in principle any desired deformation patterns at the adaptive mirror. In this case, the contributions of the individual piezoelectric layers or actuator layer systems can correspondingly add up, wherein the resulting total deformation can be described as a linear superposition e.g. of the Zernike deformations involved.

The above-described provision of any desired deformation patterns can in turn be effected without this necessitating (as in the conventional construction from FIG. 10A) voltage profiles varying laterally across the mirror. Rather, for the driving of the individual piezoelectric layers or actuator layer systems, analogously to the abovementioned embodiments according to the invention, simple, planar electrodes are sufficient here, too, which can be realized in particular exclusively "from the side" (i.e. substantially within the plane of the relevant electrode or perpendicular to the stacking direction of the layer construction of the adaptive mirror), wherein once again this avoids routing of said leads "in the stacking direction" of the layer construction of the adaptive mirror, which routing is problematic from a production engineering standpoint.

The mirror can be in particular a mirror for a microlithographic projection exposure apparatus. However, the invention is not restricted thereto. In further applications, a mirror according to the invention can also be employed or utilized for example in an apparatus for mask metrology.

In accordance with one embodiment, the mirror is designed for an operating wavelength of less than 30 nm, in particular less than 15 nm. However, the invention is not restricted thereto, and so in further applications the invention can also be realized advantageously in an optical system having an operating wavelength in the VUV range (e.g. of less than 200 nm).

The invention furthermore relates to an optical system of a microlithographic projection exposure apparatus, in particular an illumination device or a projection lens, comprising at least one mirror having the above-described features, in particular comprising in each case at least one actuator layer system situated between two electrode arrangements, and also to a microlithographic projection exposure apparatus.

The piezoelectric layers used according to the invention, or actuator layer systems comprising such piezoelectric layers, can also be provided on different mirrors. In accordance with one embodiment, the optical system thus comprises a plurality of mirrors having the above-described features, wherein the actuator layer systems of different mirrors differ from one another with regard to the deformation modes induced in the wavefront of light reflected at the respective mirror.

Further configurations of the invention can be gathered from the description and the dependent claims.

The invention is explained in greater detail below on the basis of exemplary embodiments illustrated in the accompanying figures.

BRIEF DESCRIPTION OF THE DRAWINGS

In the figures:

FIGS. 2-4 show schematic illustrations for describing various embodiments of an adaptive mirror according to the invention, where FIG. 2 shows a mirror with a piezoelectric layer having a locally varying thickness profile, FIG. 3 shows a mirror with a piezoelectric layer having a locally varying stoichiometry, and FIG. 4 shows a mirror with a dielectric layer of locally varying thickness associated with a piezoelectric layer of locally constant thickness;

FIGS. 10A-10B show schematic illustrations for describing the construction (FIG. 10A) and functioning (FIG. 10B) of a conventional adaptive mirror.

DETAILED DESCRIPTION

Figure 1:
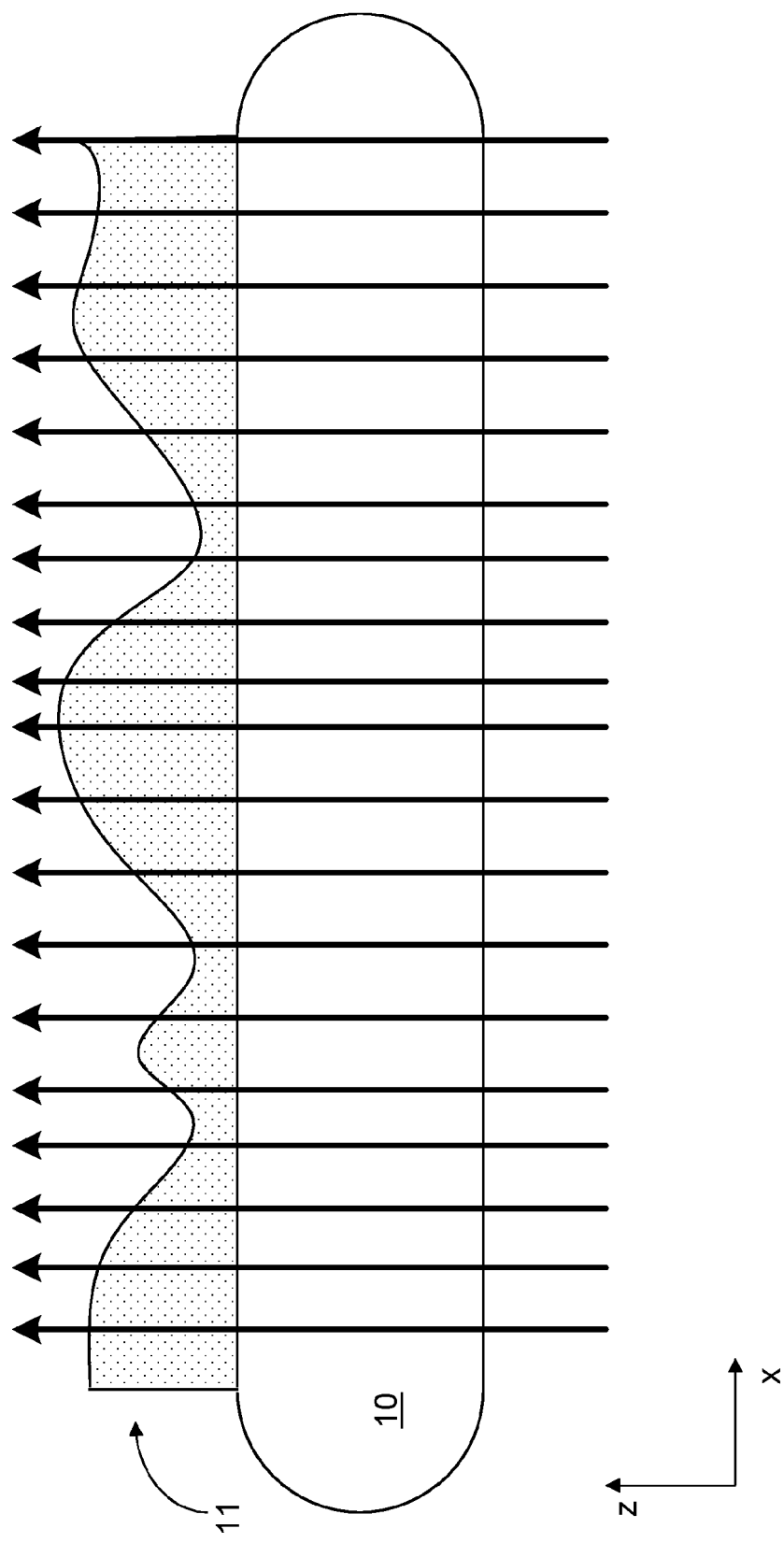
FIG. 1 shows a schematic illustration for explaining a concept underlying the present invention.
Figure 10A:
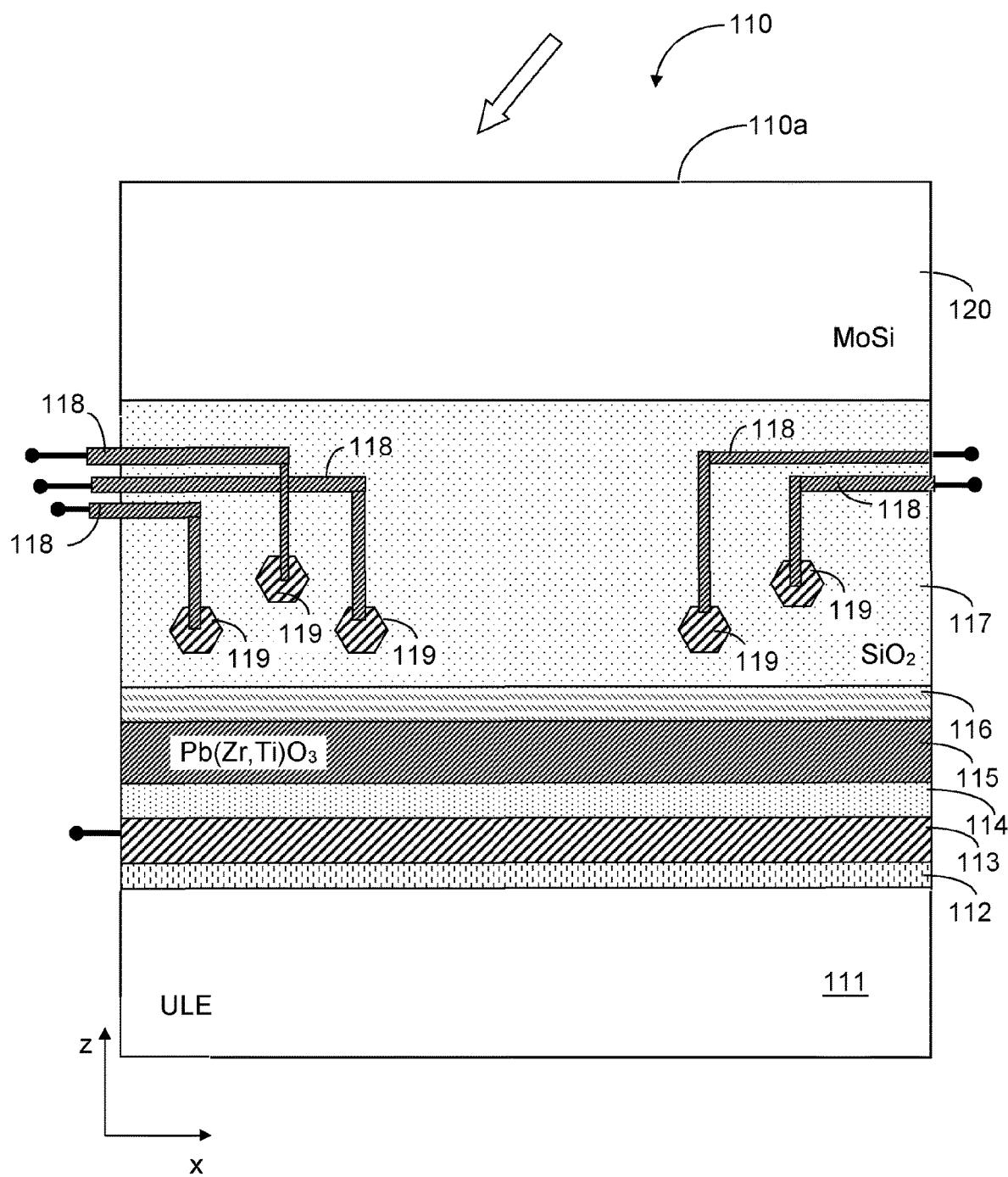

The embodiments of an adaptive mirror described below have in common that a desired deformation profile produced by an electrical voltage being applied to a piezoelectric layer by way of electrode arrangements, with regard to its local variation, does not originate from a local voltage variation introduced by way of the electrode arrangements (as illustrated in accordance with FIG. 10B for a conventional adaptive mirror). Instead, the desired deformation profile originates from a local variation of the deformation response of the piezoelectric layer or an actuator layer system comprising said piezoelectric layer. In FIG. 1 and FIG. 10B, the deformation response of the respective adaptive mirror is illustrated schematically and designated by "11" and "125", respectively, whereas the substrate of the relevant adaptive mirror is designated by "10" and "111" respectively. The profile of the electric field strength generated by way of the electrodes (not illustrated in FIG. 1 and FIG. 10B) is symbolized by way of arrows.

Owing to the local variation according to the invention of the deformation response (in particular of the $d_{33}$ coefficient of the piezoelectric layer), in accordance with FIG. 1 it is possible to achieve a desired, locally varying surface profile of the adaptive mirror even with a constant profile (present in accordance with FIG. 1) of the electric field strength. Accordingly, the electrode arrangements used to generate the relevant electric field in the region of the piezoelectric layer, on both sides of the piezoelectric layer, can also be configured as in each case a single, continuously planar electrode. However, the invention is not restricted thereto, and so (as will be explained in even greater detail with reference to FIG. 6) it is intended also to encompass configurations with a certain number (which however is comparatively small in comparison with a conventional adaptive mirror) of electrodes.

The locally varying deformation response mentioned above can be realized according to the invention in various ways, as described below with reference to FIGS. 2-4.

Figure 2:
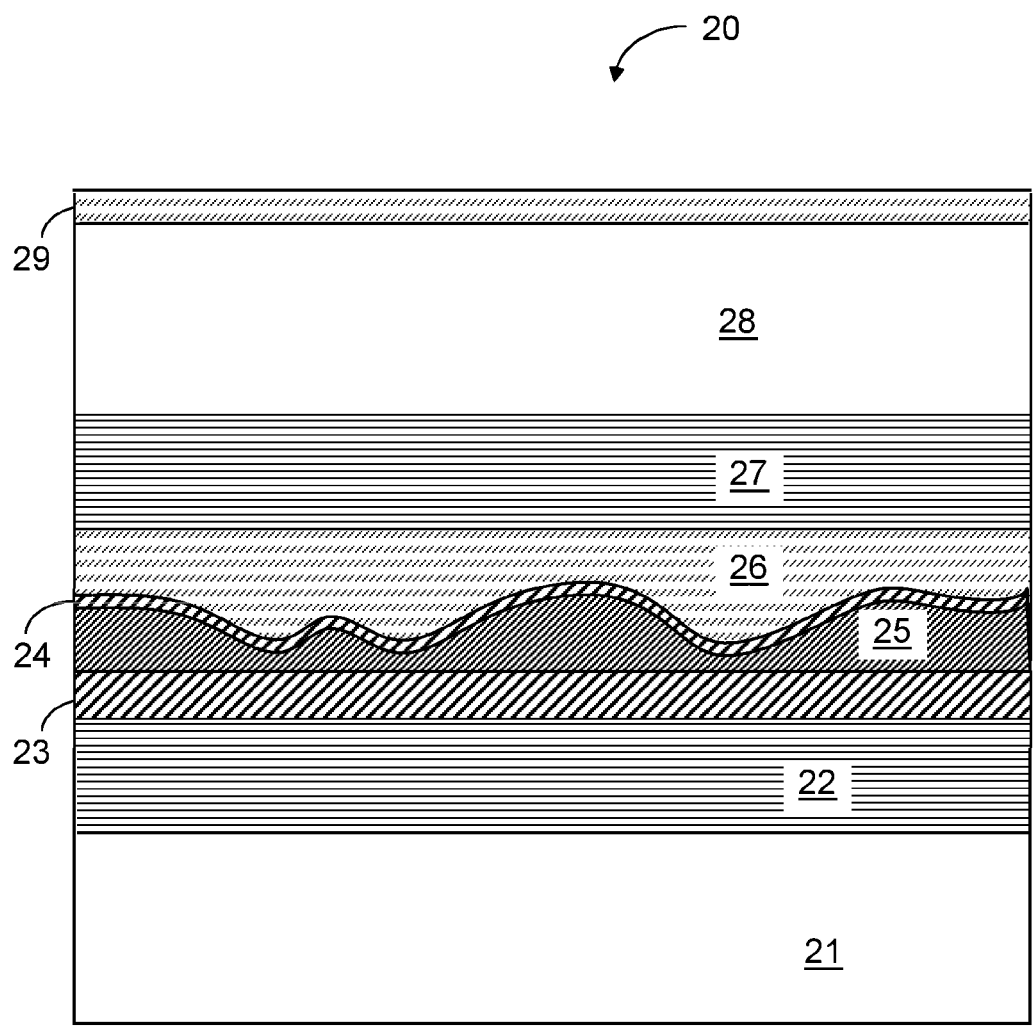

FIG. 2 shows, in a schematic and likewise simplified illustration, the possible construction of an adaptive mirror 20 according to the invention, which can be in particular an EUV mirror of an optical system, in particular of the projection lens or of the illumination device of a microlithographic projection exposure apparatus. The impingement of electromagnetic EUV radiation on the optical effective surface of the mirror 20 during operation of the optical system can result in an inhomogeneous volume change of the mirror substrate 21 on account of the temperature distribution which results from the absorption of radiation impinging inhomogeneously on the optical effective surface. In order to correct such an undesired volume change or else in order to correct other aberrations that occur during operation of the microlithographic projection exposure apparatus, the mirror 20 is of adaptive design, as is explained in greater detail below.

The mirror 20 comprises a mirror substrate 21 composed of any suitable mirror substrate material. One suitable mirror substrate material is, for example, titanium dioxide ($TiO_2$)-doped quartz glass, such as e.g. the material sold under the trade name ULE® (from Corning Inc.). A further suitable mirror substrate material is, for example, a lithium aluminium silicon oxide glass ceramic, such as e.g. the material sold under the trade name Zerodur® (from Schott AG).

There are arranged on the mirror substrate 21 of the mirror 20 a functional layer stack 22 (which can comprise e.g. a smoothing layer, a substrate protection layer, a stress-reducing layer and optionally further functional layers) and also electrode arrangements 23, 24 for applying electrical voltage to a piezoelectric layer 25 situated therebetween. "27" denotes a further functional layer stack, on which a reflection layer stack 28 and also an upper capping layer 29 follow in the layer construction. Merely by way of example, the reflection layer stack 28 can comprise a molybdenum-silicon (Mo—Si) layer stack. Without the invention being restricted to specific configurations of this layer stack, one suitable construction that is merely by way of example can comprise approximately 50 plies or layer packets of an actuator layer system comprising molybdenum (Mo) layers having a layer thickness of in each case 2.4 nm and silicon (Si) layers having a layer thickness of in each case 3.3 nm.

In the exemplary embodiment, the piezoelectric layer 25 is produced from lead zirconate titanate (Pb(Zr,Ti)O$_3$, PZT). In further embodiments, the piezoelectric layer 25 can also be produced from some other suitable material (e.g. aluminium nitride (AlN), aluminium scandium nitride (AlScN), lead magnesium niobate (PbMgNb) or vanadium-doped zinc oxide (ZnO)). The piezoelectric layer 25 can have for example thicknesses of less than 5 μm, more particularly thicknesses in the range of 1 μm to 4 μm.

In accordance with FIG. 2, the mirror 20, for the purpose of providing the locally varying deformation response (to an electric field generated by way of the electrode arrangements 23, 24) explained with reference to FIG. 1, has a locally varying thickness profile in the piezoelectric layer 25. Since the electrode arrangements 23, 24 are realized in each case as electrodes which are continuous over their entire surface area, and generate an electric field which is substantially constant locally in the region of the piezoelectric layer 25 upon application of voltage, the thickness profile of the piezoelectric layer 25 is chosen precisely such that a desired (target) deformation profile $D(x,y)=U*d_{33}(x,y)$ is impressed on the mirror 20 on account of the local variation of the $d_{33}$ coefficient for a predefined locally constant voltage U.

The thickness variation of the piezoelectric layer 25 can be established in a targeted manner in terms of production engineering through corresponding adaptation of the residence times in the coating process, wherein the resulting surface defect, as illustrated in FIG. 2, for example, can be compensated for with an additional smoothing layer or polishing layer 26. In accordance with FIG. 2, said smoothing layer or polishing layer 26 is arranged on the side of the (in the direction of the optical effective surface upper) electrode arrangement 24 facing away from the substrate 21, such that the electrode arrangement 24 itself still follows the thickness profile of the piezoelectric layer 25. In a further embodiment, the resulting surface defect mentioned above can also be allowed for on the part of the substrate 21.

As an alternative or in addition to a thickness variation of the piezoelectric layer, the stoichiometry thereof can also vary in a targeted manner in order to realize the respectively desired local profile of the deformation response. Said stoichiometry of the piezoelectric layer can in turn be set in a targeted manner by the setting of the stoichiometry of the target in the coating process, the gas filling of the coating chamber and the substrate temperature at the growth location. Furthermore, the morphological structure of the piezoelectric layer (e.g. with regard to column structure, column diameter and column transition regions) can also be designed to be locally variable in a suitable manner in order to achieve the respectively desired local profile of the deformation response.

FIG. 3 shows a corresponding exemplary embodiment, wherein components that are analogous or substantially functionally identical in comparison with FIG. 2 are designated by reference numerals increased by "10". In this case, the piezoelectric layer 35 in accordance with FIG. 3 has geometrically a constant thickness, wherein the local variation of the deformation response is achieved here solely by way of the variation of the stoichiometry of the piezoelectric layer 35 as described above.

Figure 4:
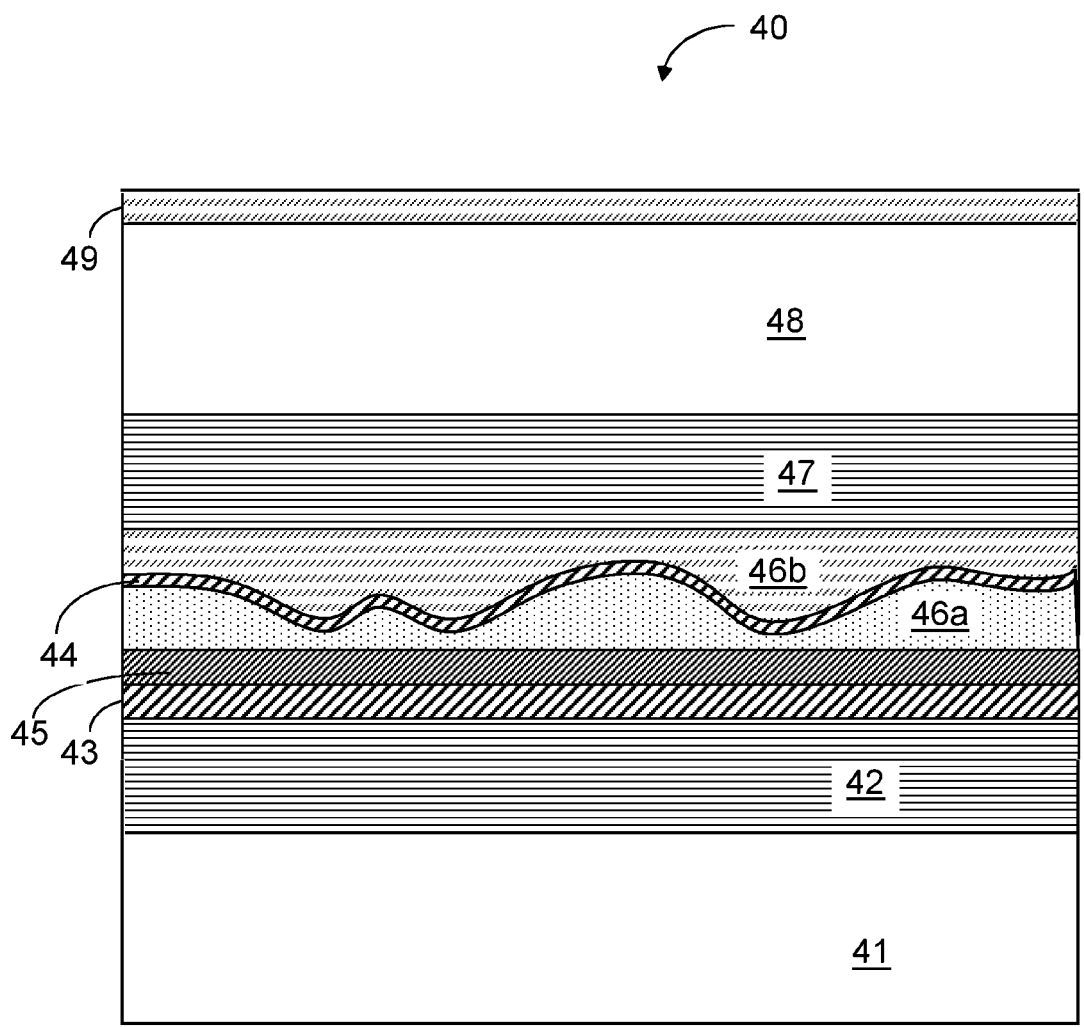

FIG. 4 shows a further possible configuration of an adaptive mirror 40, wherein components that are analogous or substantially functionally identical in comparison with FIG. 3 are in turn designated by reference numerals increased by "10". In accordance with FIG. 4, the local variation according to the invention of the deformation response is achieved by way of a further dielectric layer 46a, used in combination with the piezoelectric layer 45, with suitable thickness variation. What is achieved by way of said dielectric layer 46a is that the voltage drop that occurs on the part of the piezoelectric layer 45 when voltage is applied to the electrode arrangements 43, 44 varies according to a non-linear characteristic curve. Here as well (analogously to FIG. 2 in this respect) the resulting surface defect is compensated for by way of an additional smoothing layer or polishing layer 46b, which, in accordance with FIG. 4, is arranged on the side of the (in the direction of the optical effective surface upper) electrode 44 facing away from the substrate 41, such that the electrode 44 itself still follows the thickness profile of the dielectric layer 46a.

Merely by way of example, the dielectric layer 46a can be produced from titanium dioxide (rutile, TiO$_2$). Other dielectric materials are likewise usable, the dielectric constant preferably being in the range of 20 to 200, more preferably in the range of between 50 and 150. The thickness variation can be effected in particular in the range of 5 nm to 1000 nm, more particularly in the range of 10 nm to 300 nm.

The value of the electrical voltage applied by way of the respective electrode arrangements in the embodiments described above can be set for example in the range of 0 V to 200 V, in particular in the range of 0 V to 100 V.

Figure 5:
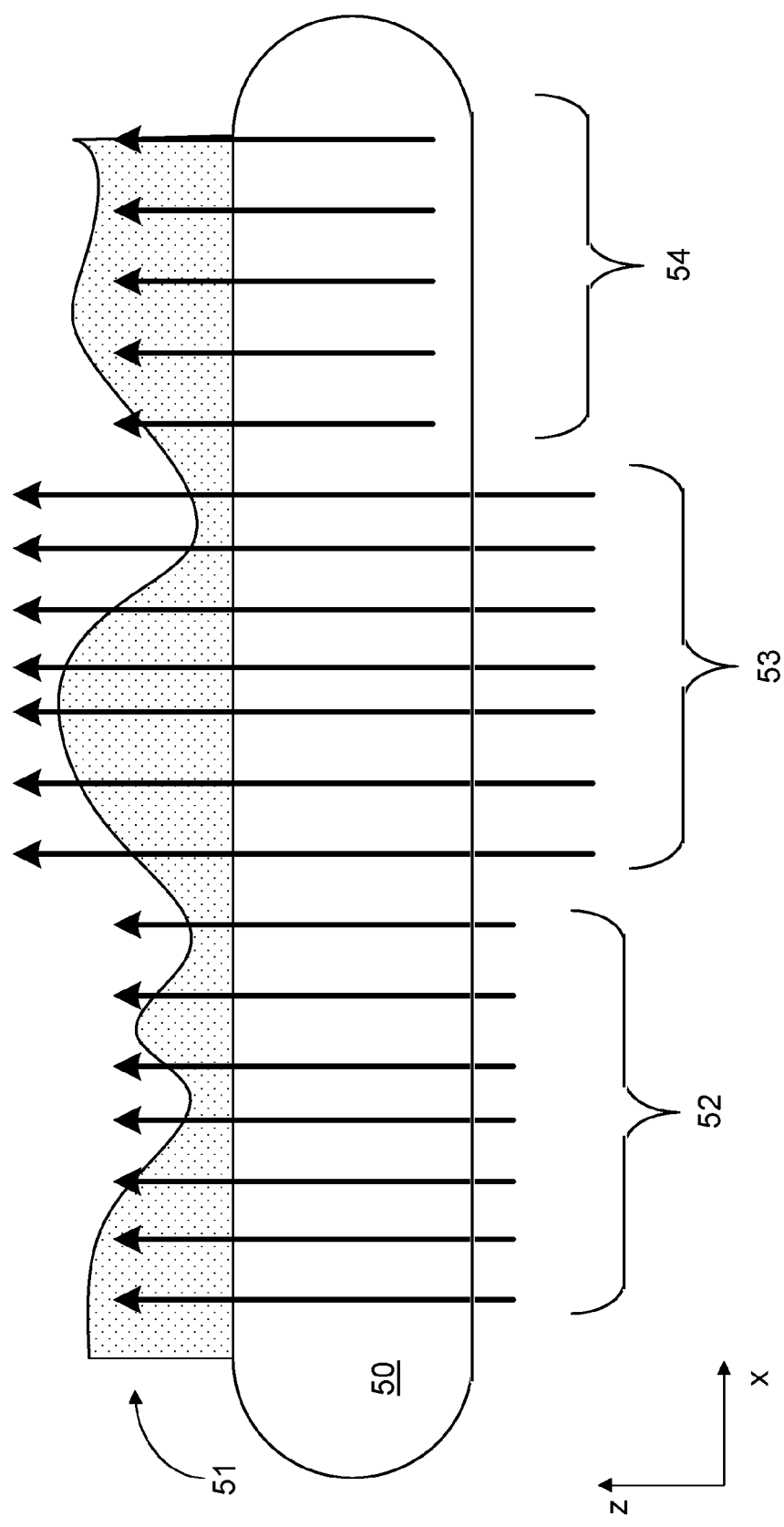
FIGS. 5-6 show schematic illustrations for describing further embodiments of the invention with the use of an electrode arrangement subdivided into a few planar electrodes, conceptually (FIG. 5) and geometrically (FIG. 6)

Even though, in the embodiments described above, in each case a locally substantially constant electric field is generated in the region of the respective piezoelectric layer and, for this purpose, in each case only a single, continuously planar electrode is present on both sides of the piezoelectric layer (or of the actuator layer system formed from piezoelectric layer 45 and dielectric layer 46a in accordance with FIG. 4), the invention is not restricted thereto. In this regard, for the purpose of providing additional degrees of freedom with regard to settable deformation profiles of the adaptive mirror, an electrode arrangement—as indicated in FIG. 5—can also be constructed from a few (in particular fewer than 20, more particularly fewer than 10) respectively planar electrodes, wherein adjacent electrodes are separated from one another by way of electrically insulating separating regions. In order to minimize the (non-piezo-actuated) trenches caused by the separating regions, the separating regions preferably have a width of less than 5 mm, more particularly less than 1 mm, more particularly less than 0.5 mm.

On account of this configuration, the electric field generated in the region of the piezoelectric layer by way of the electrode arrangements can still vary with low local resolution (in accordance with the subdivision into planar electrodes in the regions 52, 53, 54), as indicated in FIG. 5, such that an increased flexibility is achieved with regard to settable deformation profiles of the relevant adaptive mirror in comparison with the embodiments in FIGS. 1-4 (where it is possible only to set just a predefined deformation profile with a continuously selectable amplitude).

Figure 6:
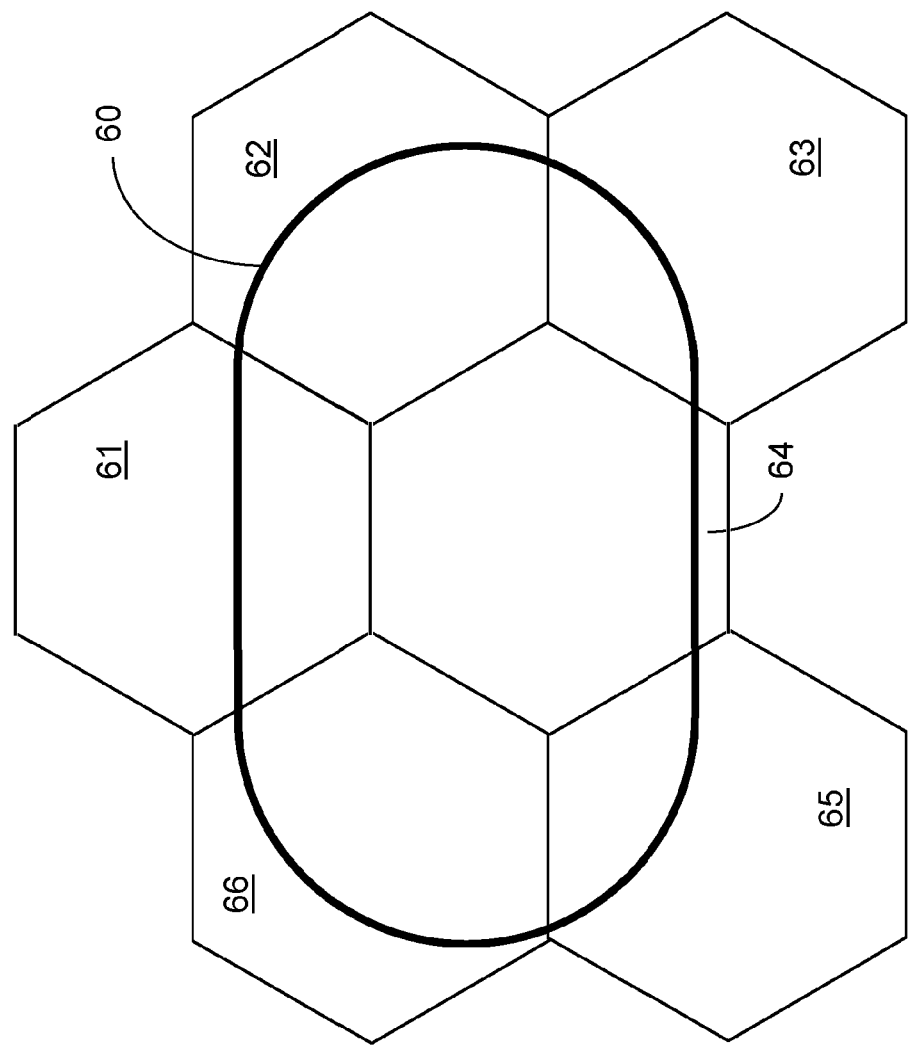

FIG. 6 shows in schematic illustration a possible geometric arrangement of a small number of electrodes 61-66 into which one of the two electrode arrangements for generating the electric field in operation of the piezoelectric layer 60 is subdivided. As evident from FIG. 6, firstly, coverage of the piezoelectric layer 60 with electrode material over virtually the entire surface area is achieved. Secondly, the geometric arrangement of the individual electrodes 61-66 is chosen in a suitable manner such that each of said electrodes 61-66 is accessible from the side for required leads for applying voltage, that is to say that routing of the leads in the stacking direction of the layer construction (i.e. in the z-direction relative to the coordinate system depicted) is avoided.

Figure 7:
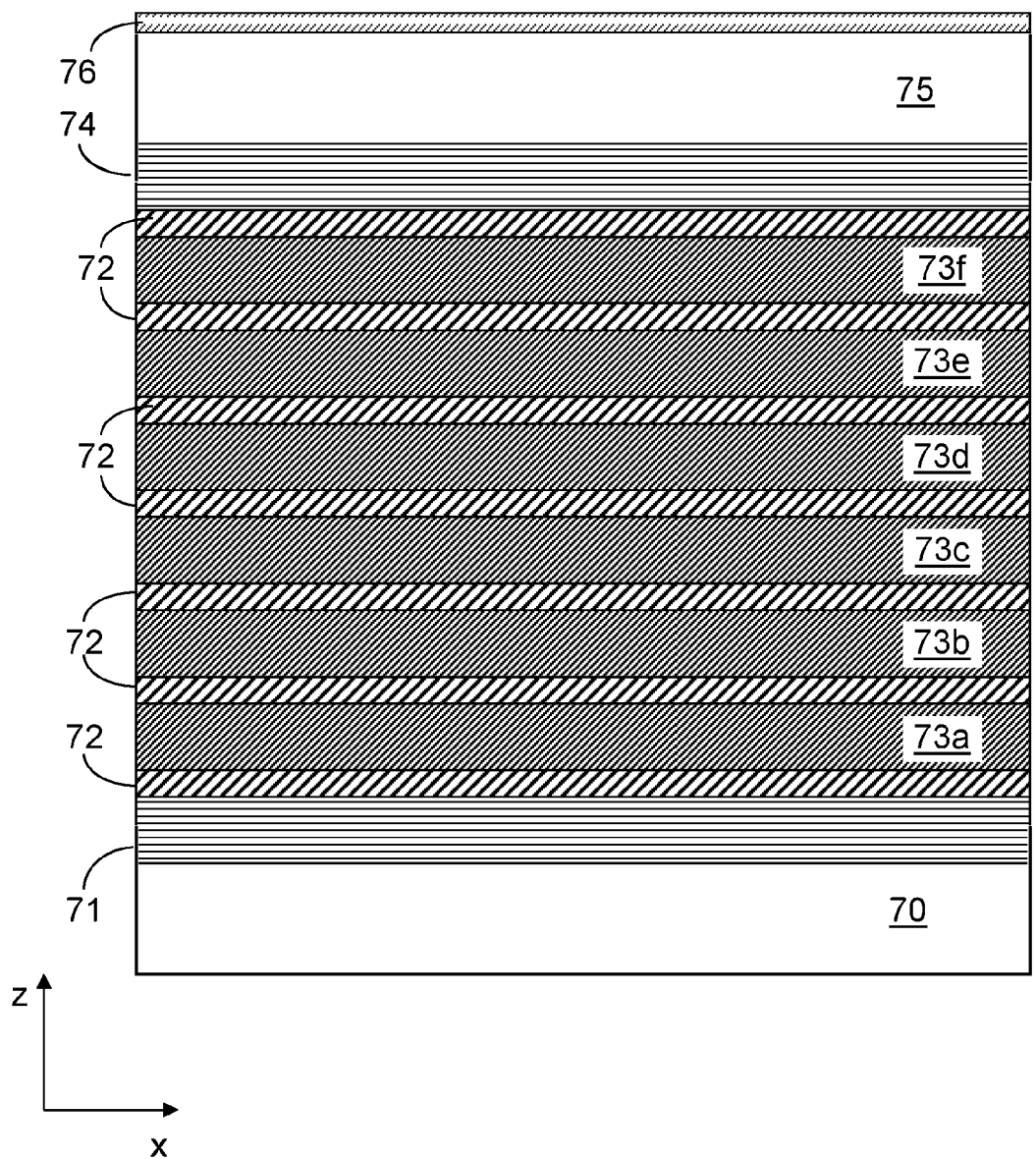
FIGS. 7-8 show schematic illustrations for describing further embodiments of an adaptive mirror with the use of a plurality of piezoelectric layers in a stacked arrangement operating with a single joint electrode arrangement (FIG. 7) and with separate respective electrode arrangements (FIG. 8)
Figure 8:
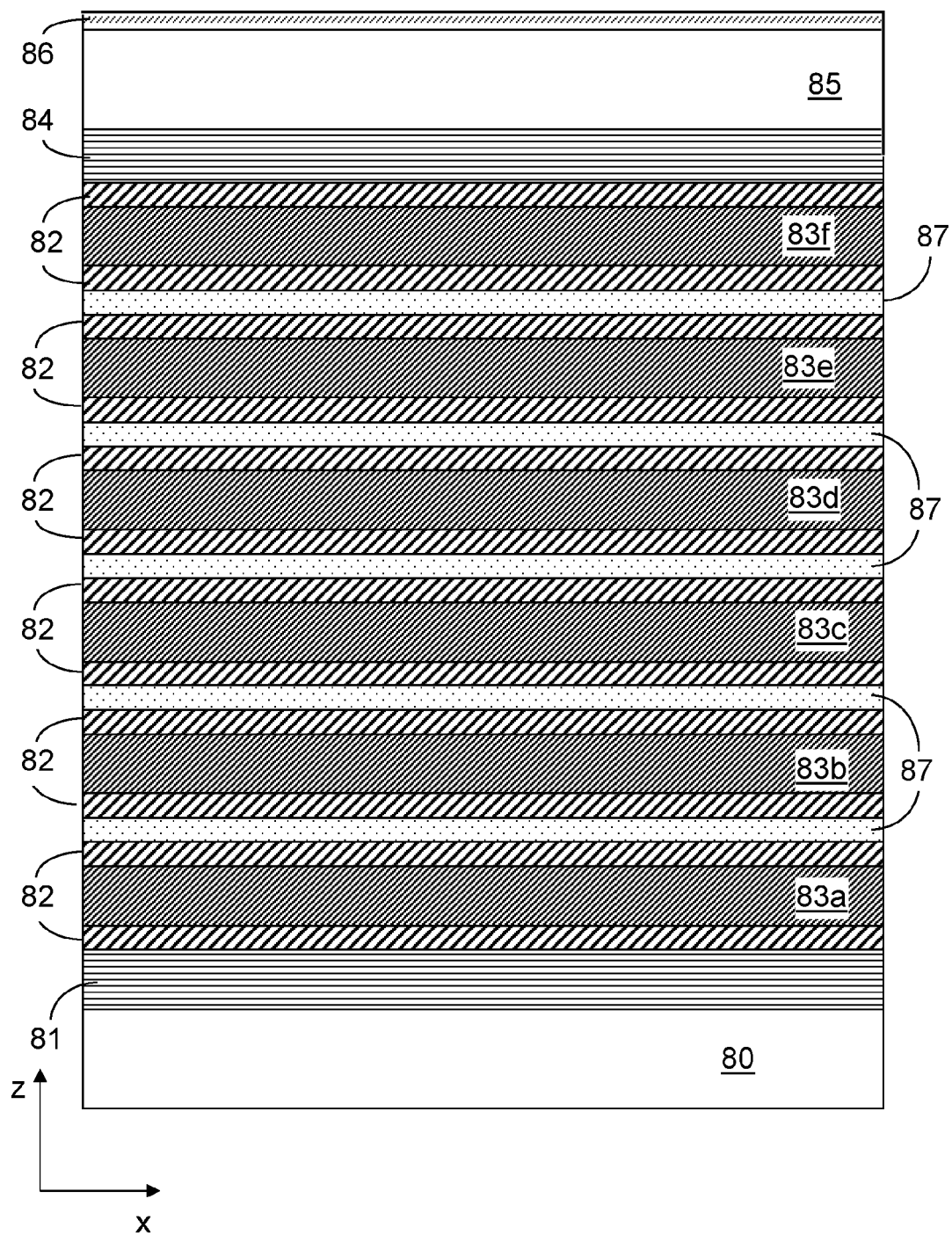

FIG. 7 and FIG. 8 show further embodiments of an adaptive mirror. This mirror firstly comprises, analogously to the embodiments described above, in each case a mirror substrate 70 and 80, respectively, functional layer stacks 71 and 74, and 81 and 84, respectively, a reflection layer stack 75 and 85, respectively, and also a capping layer 76 and 86, respectively. However, in contrast to the embodiments described above, in accordance with FIG. 7 and FIG. 8, a plurality of actuator layer systems 73a, 73b, . . . and 83a, 83b, . . . respectively, are stacked one above another, which for their part are configured in each case analogously to FIG. 2, FIG. 3 or FIG. 4, that is to say in each case comprise a piezoelectric layer—optionally in combination with a dielectric layer analogously to FIG. 4. Furthermore, an electric field is able to be applied to the actuator layer systems 73a, 73b, . . . and 83a, 83b, . . . in accordance with FIG. 7 and FIG. 8, respectively, independently of one another by way of electrode arrangements 72 and 82, respectively. The number of stacked actuator layer systems 73a, 73b, . . . and 83a, 83b, . . . , respectively, is merely by way of example in the illustration and can in principle be chosen as desired or in accordance with the specific requirements. Furthermore, although the actuator layer systems 73a, 73b, . . . and 83a, 83b, . . . in FIG. 7 and FIG. 8, respectively, are shown merely schematically and with uniform hatching for illustration reasons, they have, as described below, different profiles of the deformation response, which can in turn be achieved e.g. through locally varying layer thickness profiles and/or a locally varying stoichiometry of the respective piezoelectric layers.

The piezoelectric layers provided in a stacked arrangement in accordance with the embodiments in FIG. 7 and FIG. 8 are each driven individually by way of electrical voltages applied to the corresponding electrode arrangements 72 and 82, respectively, wherein said electrical voltages—and thus the electric fields generated in the region of the individual piezoelectric layers—can be chosen independently of one another.

The mirrors in accordance with FIG. 7 and FIG. 8, respectively, thus comprise in a stack a plurality of actuator layer systems 73a, 73b, . . . and 83a, 83b, . . . , respectively, situated in each case between two electrode arrangements 72 and 82, respectively. The individual actuator layer systems 73a, 73b, . . . and 83a, 83b, . . . , respectively, within the relevant stack in turn differ from one another in the local variation of the deformation response thereof with the consequence that mutually different actuator layer systems in said stack induce different deformation modes in the wavefront of light reflected at the mirror. Said different deformation modes can correspond in particular (but without the invention being restricted thereto) to different Zernike deformations so that e.g. the local variation of the deformation response or of the $d_{33}$ coefficient within an actuator layer system corresponds in each case to a Zernike mode.

In this connection, reference is made to the publications by J. Alda and G. D. Boreman: "Zernike-based matrix model of deformable mirrors: Optimization of aperture size," Appl. Opt. 32 (1993) 2431-2438 and V. Lakshminarayanan, Andre Fleck: "Zernike polynomials: A guide", Journal of Modern Optics 58 (2011) 545-561, DOI: 10.1080/09500340.2011.554896.

In this case, the embodiments in FIG. 7 and FIG. 8 are based on the consideration that the stacked arranged of a plurality of piezoelectric layers or of actuator layer systems 73a, 73b, . . . and 83a, 83b, . . . , respectively, comprising such piezoelectric layers has the effect that the contributions of the individual piezoelectric layers or actuator layer systems correspondingly add up, wherein the resulting total deformation can be described as a linear superposition of the involved deformation modes (e.g. Zernike deformations).

In the example of Zernike deformations, the contribution of the respective actuator layer system 73a, 73b, . . . and 83a, 83b, . . . , respectively, to the total deformation is proportional to the respective Zernike polynomial, wherein the amplitude corresponds to the respective Zernike coefficients. Exact reproduction of a freeform surface theoretically requires a sum of an infinite number of Zernike polynomials, although in practice often just a few modes already suffice to achieve a desired shape correction or aberration correction.

As a result, in accordance with the embodiments in FIGS. 7 and 8, with the use of a correspondingly high number of stacked actuator layer systems, it is thus possible in principle to set any desired deformation patterns at the adaptive mirror.

It should be pointed out that other suitable (orthogonal or else non-orthogonal) systems for the configuration of the piezoelectric layers or the deformation response thereof can also be taken as a basis instead of Zernike polynomials. Suitable functions may be for example Zernike functions scaled appropriately to match an e.g. elliptical used surface, Legendre polynomials, spline-based functions with local manifestation (e.g. shapes approximately following a Gaussian bell shape with a varying centre) or sine/cosine profiles.

The electrode arrangements 72 and 82, respectively, are configured as electrodes which are continuous over their entire surface area, analogously to the embodiments described above with reference to FIGS. 2-4, wherein, as likewise described above, leads for voltage supply can be realized exclusively "from the side" (i.e. substantially within the plane of the relevant electrode or perpendicular to the stacking direction of the layer construction of the adaptive mirror).

The embodiments in FIGS. 7 and 8 differ in that, in accordance with FIG. 7, one electrode arrangement 72 in each case is used jointly for successive actuator layer systems 73a, 73b, . . . in the stacking direction, whereas separate electrode arrangements 82 in each case are assigned to the successive actuator layer systems 83a, 83b, . . . in accordance with FIG. 8. This is achieved in accordance with FIG. 8 by virtue of the fact that successive electrode arrangements 82 in the stacking direction which are assigned to separate actuator layer systems 83a, 83b, . . . are separated from one another by way of a dielectric layer 87.

The configuration in accordance with FIG. 7 can be chosen, in particular, if the individual actuator layer systems 73a, 73b, . . . each comprise piezoelectric layers having a constant thickness in each case and having varying stoichiometry. By contrast, in a configuration in accordance with FIG. 8, the dielectric layers 87 provided for separating successive electrodes 82, and actuator layer systems 83a, 83b, . . . , can also serve for smoothing thickness profiles possibly present within the actuator layer systems 83a,

83b, . . . (e.g. the associated piezoelectric layers) at the transition to the actuator layer system respectively following in the stacking direction.

In further embodiments, the piezoelectric layers or actuator layer systems comprising such piezoelectric layers can also be provided on different mirrors.

The local variation according to the invention of the deformation response can be effected in various ways for the individual piezoelectric layers or the associated actuator layer systems in accordance with FIGS. 7-8, analogously to the above-described embodiments in FIGS. 2-4. In particular, the individual piezoelectric layers can thus have locally varying layer thickness profiles and/or stoichiometry.

Suitable coating processes for realizing such local profiles can use for example a deposition source with defined, locally varying residence times, wherein suitable deposition concepts can be based e.g. on magnetron sputtering, spatial atomic layer deposition or FEBID (="Focused Electron Beam Induced Deposition"). While e.g. any desired layer thickness profile of the respective piezoelectric layer can be realized using a single magnetron source, two sources operated simultaneously can be used for producing a piezoelectric layer having locally varying stoichiometry. When an ALD method is used, the respective precursor composition can be varied over time so that the use of one deposition source is sufficient here. In this connection, reference is made to U.S. Pat. No. 4,533,449 A and the publication by M. Huth et al.: "Focused electron beam induced deposition: A perspective", Beilstein Journal of Nanotechnology 2012, 3, 597-619.

Figure 9:
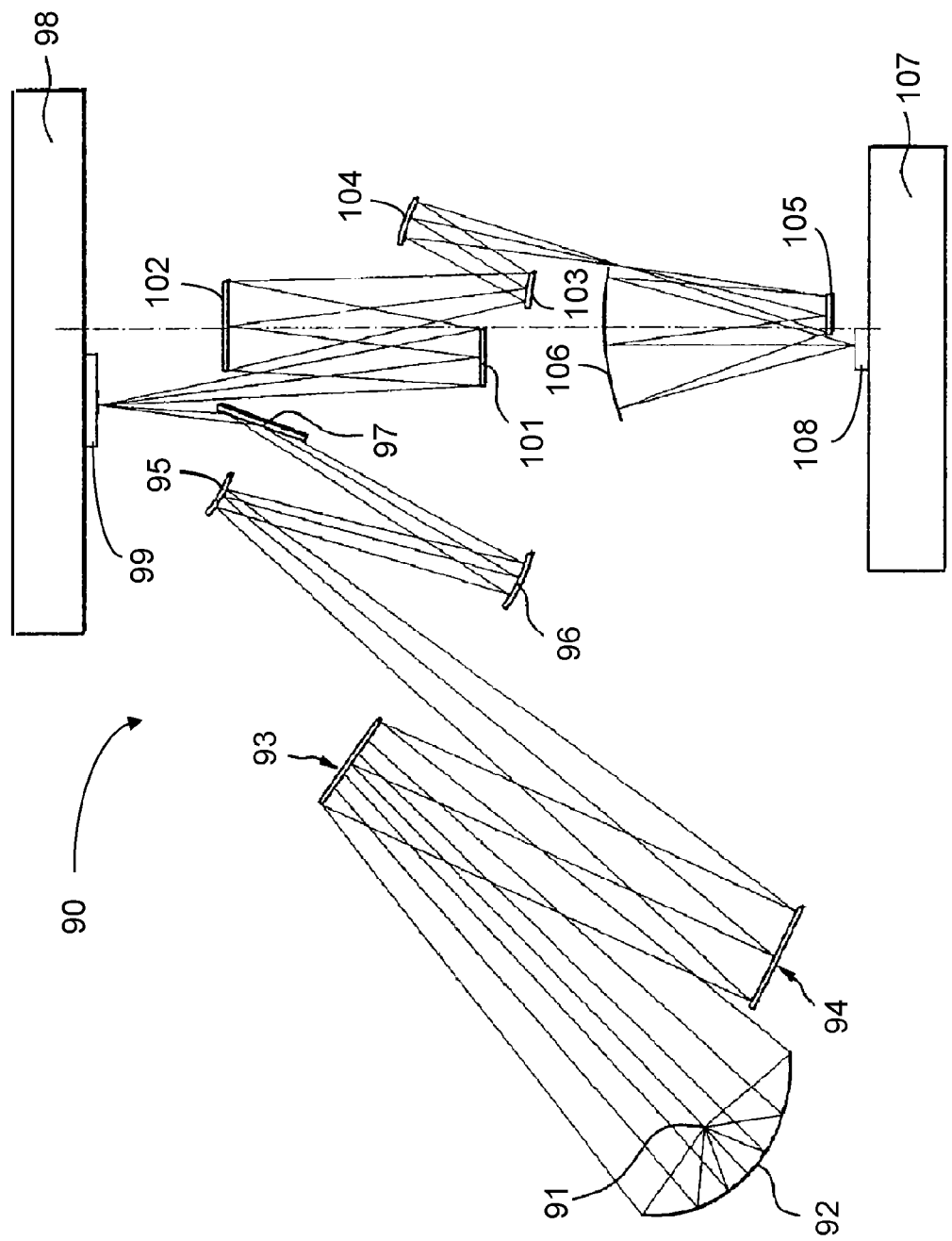
FIG. 9 shows a schematic illustration for describing the possible construction of a microlithographic projection exposure apparatus designed for operation in the EUV.

FIG. 9 shows a schematic illustration of an exemplary projection exposure apparatus which is designed for operation in the EUV and in which the present invention can be realized.

According to FIG. 9, an illumination device in a projection exposure apparatus 90 designed for EUV comprises a field facet mirror 93 and a pupil facet mirror 94. The light from a light source unit comprising a plasma light source 91 and a collector mirror 94 is directed at the field facet mirror 93. A first telescope mirror 95 and a second telescope mirror 96 are arranged in the light path downstream of the pupil facet mirror 94. A deflection mirror 97 is arranged downstream in the light path, said deflection mirror directing the radiation that is incident thereon at an object field in the object plane of a projection lens comprising six mirrors 101-106. At the location of the object field, a reflective structure-bearing mask 99 is arranged on a mask stage 98, said mask being imaged with the aid of the projection lens into an image plane in which a substrate 108 coated with a light-sensitive layer (photoresist) is situated on a wafer stage 107.

In principle all mirrors of the mirrors 101-106 of the projection lens can be configured in the manner according to the invention. In particular, an adaptive mirror according to the invention can be arranged in a near-field manner, in a near-pupil manner or else in an intermediary manner or between a field plane and a pupil plane.

Even though the invention has been described on the basis of specific embodiments, numerous variations and alternative embodiments will be apparent to a person skilled in the art, for example through combination and/or exchange of features of individual embodiments. Accordingly, such variations and alternative embodiments are encompassed by the present invention, and the scope of the invention is restricted only within the meaning of the appended patent claims and equivalents thereof.

What is claimed is:

1. Mirror with an optical effective surface, comprising:
a mirror substrate;
a reflection layer stack configured to reflect electromagnetic radiation that is incident on the optical effective surface;
at least one first electrode arrangement;
at least one second electrode arrangement; and
an actuator layer system situated between the first electrode arrangement and the second electrode arrangement,
wherein the actuator layer system is arranged between the mirror substrate and the reflection layer stack;
wherein the actuator layer system comprises a piezoelectric layer and is configured to react to an electrical voltage applied between the first electrode arrangement and the second electrode arrangement with a piezoelectric deformation response characterizing a linear deformation of the actuator layer system in a direction perpendicular to the optical effective surface for a predefined value of the electrical voltage, and
wherein the deformation response varies locally by at least 20% in a peak-to-valley (PV) value for a predefined electrical voltage that is spatially constant across the piezoelectric layer.

2. Mirror according to claim 1, wherein the deformation response varies locally by at least 50% in the PV value for a predefined electrical voltage that is spatially constant across the piezoelectric layer.

3. Mirror according to claim 2, wherein the deformation response varies locally by at least 90% in the PV value for the predefined electrical voltage that is spatially constant across the piezoelectric layer.

4. Mirror according to claim 1, wherein the piezoelectric layer has a $d_{33}$ coefficient having a value which varies locally by at least 20% in the PV value across the piezoelectric layer.

5. Mirror according to claim 4, wherein the $d_{33}$ coefficient of the piezoelectric layer has a value which varies locally by at least 90% in the PV value across the piezoelectric layer.

6. Mirror according to claim 1, wherein the actuator layer system has a locally varying thickness.

7. Mirror according to claim 6, wherein the thickness locally varies by at least 20% in the PV value.

8. Mirror according to claim 1, wherein the actuator layer system further comprises a dielectric layer.

9. Mirror according to claim 8, wherein the dielectric layer has a locally varying thickness.

10. Mirror with an optical effective surface, comprising:
a mirror substrate;
a reflection layer stack configured to reflect electromagnetic radiation that is incident on the optical effective surface;
at least one first electrode arrangement;
at least one second electrode arrangement; and
an actuator layer system situated between the first electrode arrangement and the second electrode arrangement,
wherein the actuator layer system is arranged between the mirror substrate and the reflection layer stack;
wherein the actuator layer system comprises a piezoelectric layer and is configured to react to an electrical voltage applied between the first electrode arrangement and the second electrode arrangement with a deformation response characterizing a linear deformation of the actuator layer system in a direction perpendicular to the optical effective surface for a predefined value of the electrical voltage, and wherein the deformation response varies locally by at least 20% in a peak-to-valley (PV) value for a predefined electrical voltage that is spatially constant across the piezoelectric layer, wherein the piezoelectric layer has a locally varying stoichiometry.

11. Mirror according to claim 1, wherein the first electrode arrangement and the second electrode arrangement each cover at least 99% of an optically used area of the piezoelectric layer.

12. Mirror according to claim 1, wherein the first electrode arrangement and the second electrode arrangement each have voltage feeds, all of which run perpendicularly to a surface normal of the mirror.

13. Mirror according to claim 1, wherein the actuator layer system comprises, in a stack, a plurality of the actuator layer systems each situated between two electrode arrangements.

14. Mirror according to claim 13, wherein mutually different actuator layer systems in the stack induce mutually different deformation modes in a wavefront of light reflected at the mirror.

15. Mirror according to claim 14, wherein the mutually different deformation modes correspond to respectively different Zernike deformations.

16. Mirror with an optical effective surface, comprising:
a mirror substrate;
a reflection layer stack for reflecting electromagnetic radiation that is incident on the optical effective surface;
a stack of actuator layer systems each arranged between two respective electrode arrangements, wherein the stack is arranged between the mirror substrate and the reflection layer stack;

wherein each of the actuator layer systems comprises a piezoelectric layer and is configured to react to an electrical voltage applied between the electrode arrangements with a piezoelectric deformation response characterizing a linear deformation of the respective actuator layer system in a direction perpendicular to the optical effective surface for a predefined value of the electrical voltage; and wherein mutually different actuator layer systems in the stack induce mutually different deformation modes in a wavefront of light reflected at the mirror.

17. Mirror according to claim 16, wherein the mutually different deformation modes correspond to respectively different Zernike deformations.

18. Mirror according to claim 1 and configured for an operating wavelength of less than 30 nm.

19. Mirror according to claim 1 and configured for a microlithographic projection exposure apparatus.

20. Optical system comprising at least one of an illumination device of or a projection lens of a microlithographic projection exposure apparatus, wherein the optical system comprises at least one mirror according to claim 1.

21. Optical system comprising at least one of an illumination device of or a projection lens of a microlithographic projection exposure apparatus, wherein the optical system comprises a plurality of mutually differing mirrors according to claim 16, wherein the actuator layer systems of the mutually differing mirrors differ from one another with regard to the mutually different deformation modes induced in the wavefront of light reflected at the respective mirror.

22. Microlithographic projection exposure apparatus comprising an illumination device and a projection lens, wherein the projection exposure apparatus comprises an optical system according to claim 20.

* * * * *